US007451372B2

(12) United States Patent
Konno

(10) Patent No.: US 7,451,372 B2
(45) Date of Patent: Nov. 11, 2008

(54) CIRCUIT TEST PATTERN EDITION APPARATUS, CIRCUIT TEST PATTERN EDITING METHOD, AND SIGNAL-BEARING MEDIUM EMBODYING A PROGRAM OF CIRCUIT TEST PATTERN EDITION

(75) Inventor: Yoshihiro Konno, Tokyo (JP)

(73) Assignee: NEC Corporation, Tokyo (JP)

( * ) Notice: Subject to any disclaimer, the term of this patent is extended or adjusted under 35 U.S.C. 154(b) by 214 days.

(21) Appl. No.: 11/281,747

(22) Filed: Nov. 18, 2005

(65) Prior Publication Data

US 2006/0143552 A1    Jun. 29, 2006

(30) Foreign Application Priority Data

Dec. 24, 2004    (JP)    ............... 2004-374729

(51) Int. Cl.
*G01R 31/28*    (2006.01)
(52) U.S. Cl. ...................... 714/738; 714/732
(58) Field of Classification Search ............ 714/738, 714/732
See application file for complete search history.

(56) References Cited

U.S. PATENT DOCUMENTS 5,345,450 A * 9/1994 Saw et al. .............. 714/741
6,782,501 B2 * 8/2004 Distler et al. ............ 714/738

OTHER PUBLICATIONS

Volkerink et al., Packet-based Input Test Data Compression Techniques, Oct. 7-10, 2002, IEEE, pp. 154-163.*

* cited by examiner

*Primary Examiner*—Jacques Louis-Jacques
*Assistant Examiner*—John J Tabone, Jr.
(74) *Attorney, Agent, or Firm*—McGinn IP Law Group, PLLC

(57) ABSTRACT

An apparatus that edits a test pattern used in a circuit function test includes a generator that generates a regular pattern that includes a plurality of unit patterns, by inserting a redundant pattern into a test pattern, and a pattern number reduction editor that defines the regular pattern as one unit pattern in the circuit function test.

20 Claims, 9 Drawing Sheets

UNIT PATTERN OF TEST
PATTERN DATA 11

CIRCUIT TEST PATTERN EDITION APPARATUS, CIRCUIT TEST PATTERN EDITING METHOD, AND SIGNAL-BEARING MEDIUM EMBODYING A PROGRAM OF CIRCUIT TEST PATTERN EDITION

BACKGROUND OF THE INVENTION

1. Technical Field

The present invention relates to a function test of a circuit (e.g., LSI), and more specifically to a circuit test pattern editing apparatus, circuit test pattern editing method, and signal-bearing medium embodying a program of circuit test pattern edition, for reducing the number of patterns of a test pattern used in a function test of the circuit (e.g., an LSI), and realizing a shorter clock cycle.

2. Background Art

With regard to a conventional test pattern for use in a function test of a circuit (e.g., an LSI), Japanese Patent Laid-Open No. 8-36032 describes an example of a conventional method of generating a test pattern for quickly performing a function test.

The conventional method of generating a delay/failure test pattern is an example of quickly generating a test pattern of an LSI, edits a test pattern by operating as described below, and compresses (reduces) the number of patterns.

That is, the conventional method of generating a delay/failure test pattern reads the number of patterns, input data, and clock signals for use in a function test in a period of test pattern.

Next, unless a clock signal and input data are simultaneously changed, it is determined that a pattern can be compressed, and the clock patterns expressed by "0", "1", and "0", or three patterns of "0", "1", and "0" are defined as one pulse pattern of "P" or "N".

Additionally, a test pattern is generated with the information that the pattern can be quickly processed set as speed information.

Then, a tester object for an LSI tester is generated from the test pattern as a delay/failure test pattern with the number of patterns reduced.

SUMMARY OF THE INVENTION

However, there have been several problems with the above-mentioned conventional technology.

A first problem is that the number of patterns cannot be reduced when a test pattern contains different input data at both edges (e.g., rising and falling edges) of a clock signal for the following reason.

For example, in the conventional technology having the condition that a clock signal and input data are not simultaneously changed, the allowable frequency of a change of input data in a period is limited to 1 (one).

When input data of a test pattern are different at both edges (e.g., rising and falling edges) of a clock signal, there may be two or more changes of input data in a period. Therefore, in the conventional technology where the above-mentioned restriction is placed, the clock pattern expressed by the three patterns cannot be edited into one pulse pattern when a clock signal is changed.

A second problem is that the number of patterns cannot be reduced because of the above-mentioned first problem, thereby failing in speeding up the clock cycle.

In view of the foregoing and other exemplary problems, drawbacks, and disadvantages of the conventional techniques, it is an exemplary feature of the present invention to provide a circuit test pattern editing apparatus, circuit test pattern editing method, and signal-bearing medium embodying a program of circuit test pattern edition.

The present invention provides an apparatus that edits a test pattern used in a circuit function test including a generator that generates a regular pattern that includes a plurality of unit patterns, by inserting a redundant pattern into a test pattern, and a pattern number reduction editor that defines the regular pattern as one unit pattern in the circuit function test.

With the present invention, the number of patterns of the test pattern may be reduced by defining the regular pattern as one unit pattern in the circuit function test.

In the present invention, a second test pattern may include repeated ones of the regular pattern.

The test pattern may include input data relating to the circuit function test, and a clock signal relating to the circuit function test. When the input data varies between a leading edge and a trailing edge of the clock signal, the redundant pattern may be inserted into the test pattern so that the leading edge and the trailing edge of the clock signal, respectively, are allocated to different ones of the regular pattern.

When the input data is changed only once per regular pattern, in the same type of clock signal, the regular pattern may be defined as one unit pattern in the circuit function test.

The test pattern may further include an expected value obtained corresponding to input data relating to the function test. The redundant pattern may be inserted into the test pattern so that the regular pattern includes each of a timing of analyzing presence/absence of a change of the input data, a timing of analyzing presence/absence of a change of the clock signal, and a timing of analyzing presence/absence of a change of the expected value, at least once, and each of the timings in a first pattern occurs correspondingly in a second pattern.

Therefore, by configuring each regular pattern with the same timing, the number of unit patterns in the circuit function test may be compressed, and thus, a clock cycle may be shortened.

In the present invention, a first regular pattern may refer to a pattern from the unit pattern located at a head of the test pattern to the unit pattern simultaneously having the timing of analyzing presence/absence of a change of the input data, the timing of analyzing presence/absence of a change of the clock signal, and the timing of analyzing presence/absence of the expected value. The first pattern may be defined at a time of last instance of a first change in the clock signal, the input data, and the expected value.

In the present invention, a highest frequency of changes of the data input for one regular pattern, a highest frequency of changes of the clock signal for one regular pattern, and a highest frequency of changes of the expected value for one regular pattern, may be defined as frequencies of the each of the timings in the regular pattern.

The apparatus may further include a calculator that calculates each of the timings by analyzing the first test pattern.

The apparatus may input a parameter that includes a timing of analyzing presence/absence of a change of the input data, a timing of analyzing presence/absence of a change of the clock signal, and a timing of analyzing presence/absence of the expected value, and the each of timings in the regular pattern may be the same as those in the parameter.

Since the number of patterns is reduced when the generated varied test pattern and the test pattern before the variation, have the same operations, the accuracy of a function test may be maintained.

The apparatus may further include a verifier that verifies whether or not a second circuit test pattern and the test pattern perform a same operation. When the verifier determines that the same operation is performed, the pattern number reduction edit unit may define the regular pattern as one unit pattern in the circuit function test.

The present invention also provides a method of editing a circuit test pattern used in a circuit function test, including generating a regular pattern that includes a plurality of unit patterns, by inserting a redundant pattern into a test pattern, and defining the regular pattern as one unit pattern in the circuit function test.

The method may further include providing a second circuit pattern that includes repeated ones of the regular pattern.

The method may further include providing the test pattern with input data relating to the circuit function test, providing the test pattern with a clock signal relating to the circuit function test, and inserting the redundant pattern into the test pattern so that the leading edge and the trailing edge of the clock signal, respectively, are allocated to different ones of the regular patterns, when the input data varies between the leading edge and the trailing edge of the clock signal.

The method may further include obtaining an expected value corresponding to input data relating to the function test, inserting the redundant pattern into the test pattern so that the regular pattern includes each of a timing of analyzing presence/absence of a change of the input data, a timing of analyzing presence/absence of a change of the clock signal, and a timing of analyzing presence/absence of a change of the expected value, at least once, and each of the timings in a first pattern occurs correspondingly in a second pattern.

The method may further include referring a first the regular pattern to a pattern from the unit pattern located at a head of the test pattern to the unit pattern simultaneously having the timing of analyzing presence/absence of a change of the input data, the timing of analyzing presence/absence of a change of the clock signal, and the timing of analyzing presence/absence of the expected value, and defining the first pattern at a time of last instance of a first change in the clock signal, the input data, and the expected value.

The method may further include defining a highest frequency of changes of the data input for one regular pattern, a highest frequency of changes of the clock signal for one regular pattern, and a highest frequency of changes of the expected value for one regular pattern, as frequencies of the each of the timings in the regular pattern.

The method may further include calculating each of the timings by analyzing the test pattern.

The method may further include inputting a parameter that includes a timing of analyzing presence/absence of a change of the input data, a timing of analyzing presence/absence of a change of the clock signal, and a timing of analyzing presence/absence of the expected value. The each of timings in the regular pattern may be the same as those in the parameter.

The method may further include verifying whether or not a second circuit test pattern and the test pattern perform a same operation, and defining the regular pattern as one unit pattern in the circuit function test, when the verifier determines that the same operation is performed.

The present invention also provide a signal-bearing medium embodying a program of machine-readable instructions executable by an apparatus, the program causing an apparatus to perform the method of editing a circuit test pattern used in a circuit function test, including generating a regular pattern that includes a plurality of unit patterns, by inserting a redundant pattern into a test pattern, and defining the regular pattern as one unit pattern in the circuit function test.

As described above, for example, a regular pattern that includes a plurality of unit patterns is generated by inserting a redundant pattern into a test pattern, and a regular pattern is defined as one unit pattern in the circuit function test. Therefore, the number of patterns can be reduced and the clock cycle can be increased.

According to the inventive test pattern edition apparatus, the test pattern edition program, and the test pattern editing method, many advantages can be attained.

For example, according to the present invention, the number of patterns can be reduced for the test pattern for use in a function test of an LSI.

For example, a regular pattern that includes a plurality of unit patterns is generated by inserting a redundant pattern into a test pattern, and a regular pattern is defined as one unit pattern in the circuit function test.

According to the present invention, for example, the number of patterns may be reduced although a test pattern has different input data at both edges (e.g., rising and falling edges) of a clock signal.

For example, the test pattern may include input data relating to the circuit function test, and a clock signal relating to the circuit function test. When the input data vary between a leading edge and a trailing edge of the clock signal, the redundant pattern may be inserted into the test pattern so that the leading edge and the trailing edge of the clock signal, respectively, are allocated to different regular patterns.

Additionally, according to the present invention, for example, the clock cycle may be increased although a test pattern has different input data at both edges of a clock signal.

For example, the test pattern may include an expected value obtained corresponding to input data relating to the function test. The redundant pattern may be inserted into the test pattern, so that the regular pattern includes each of a timing of analyzing presence/absence of a change of the input data, a timing of analyzing presence/absence of a change of the clock signal, and a timing of analyzing presence/absence of a change of the expected value, (at least once) and each of the timing in a first pattern occurs correspondingly in a second pattern.

Furthermore, according to the present invention, for example, the number of patterns may be reduced and the accuracy of a function test can be maintained although a test pattern has different input data at both edges of a clock signal.

For example, a verifier may verify whether or not the second circuit test pattern (e.g., varied test pattern) and the test pattern have the same operation. When the verifier determines that the same operation is performed, the pattern number reduction edit unit may define the regular pattern as one unit pattern in the circuit tester (e.g., the number of patterns may be reduced).

BRIEF DESCRIPTION OF THE DRAWINGS

The novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

Example 1

The exemplary embodiments of the present invention are explained in detail by referring to the attached drawings.

Technical terms used in this exemplary embodiment will be explained below as an example.

Figure 8:
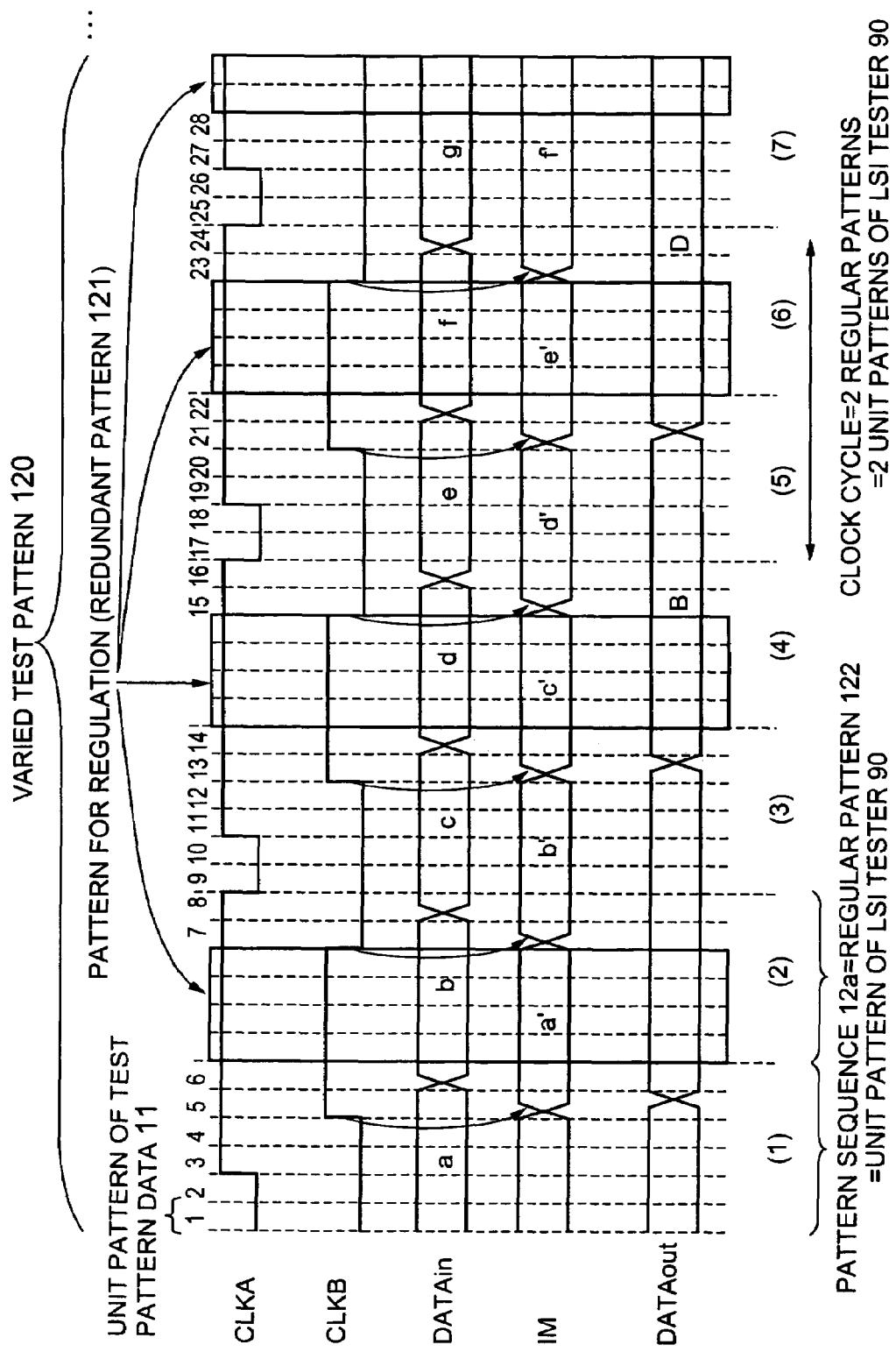
FIG. 8 shows a test pattern after editing of test pattern 11 according to the first embodiment of the present invention.

"Unit pattern" may refer to:
1. unit pattern of test pattern data 11 (e.g., unit pattern of test pattern data 11, 1, 2, 3 , , , 28, respectively, shown in FIG. 8)
2. unit pattern of LSI tester 90 (circuit function test) (e.g., unit pattern of LSI tester 90 (1), (2), (3) , , , (7) shown in FIG. 8)

"Regular pattern 122" may refer to pattern sequences (1), (2) , , , (7), respectively, or unit pattern of LSI tester 90 (1), (2) , , , (7), respectively, shown in FIG. 8.

"Second test pattern (e.g., varied test pattern 120)" may refer to the whole pattern sequences (1), (2) , , , (7) shown in FIG. 8.

Figure 4:
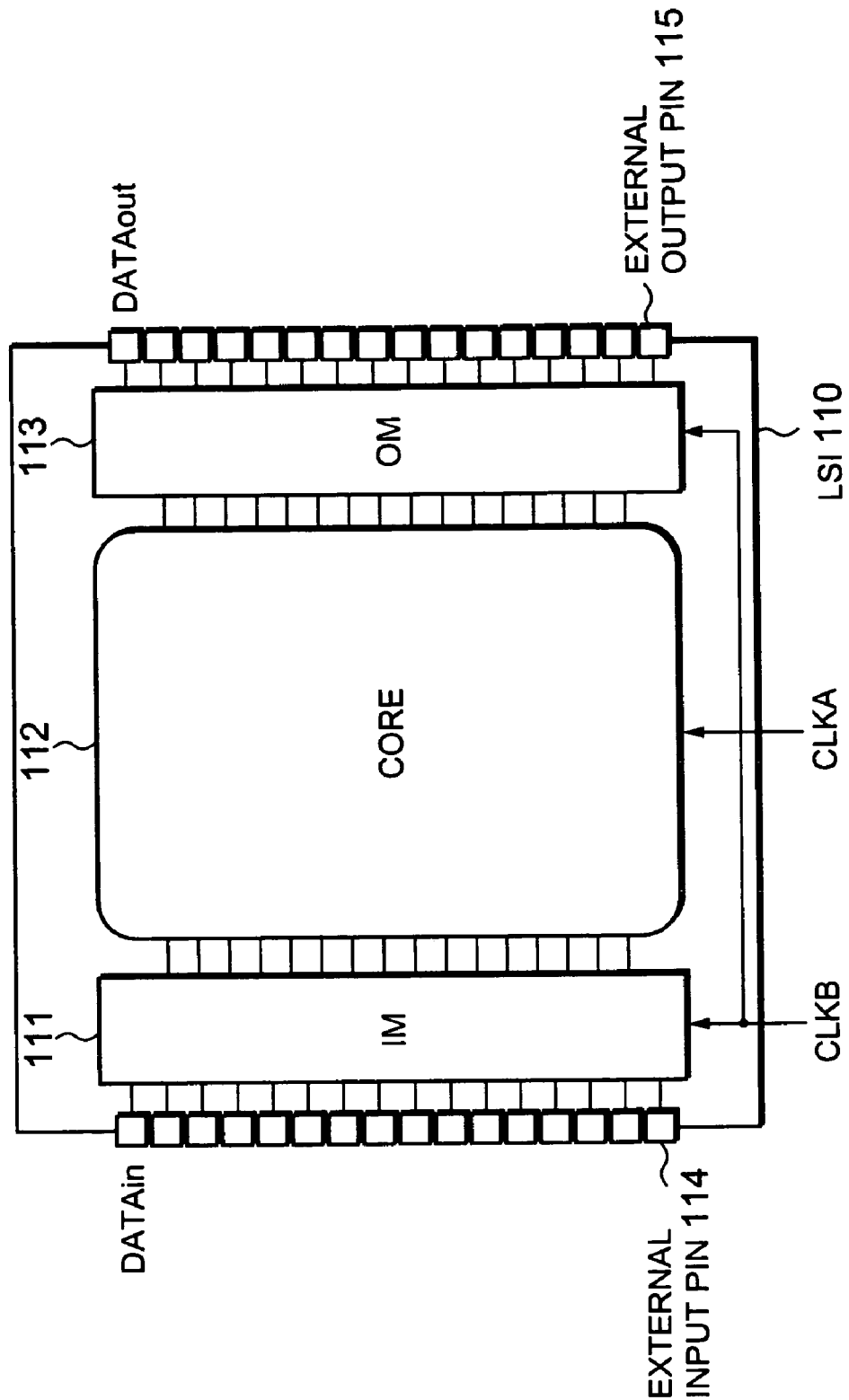
FIG. 4 shows an exemplary schematic chart of LSI 110 according to the first exemplary embodiment of the present invention.

"Input data" may refer to input data of an external input pin 114 (e.g., DATAin shown in FIG. 4)

"Expected value" may refer to an expected value of external output pin 115 (e.g., DATAout shown in FIG. 4).

Figure 1:
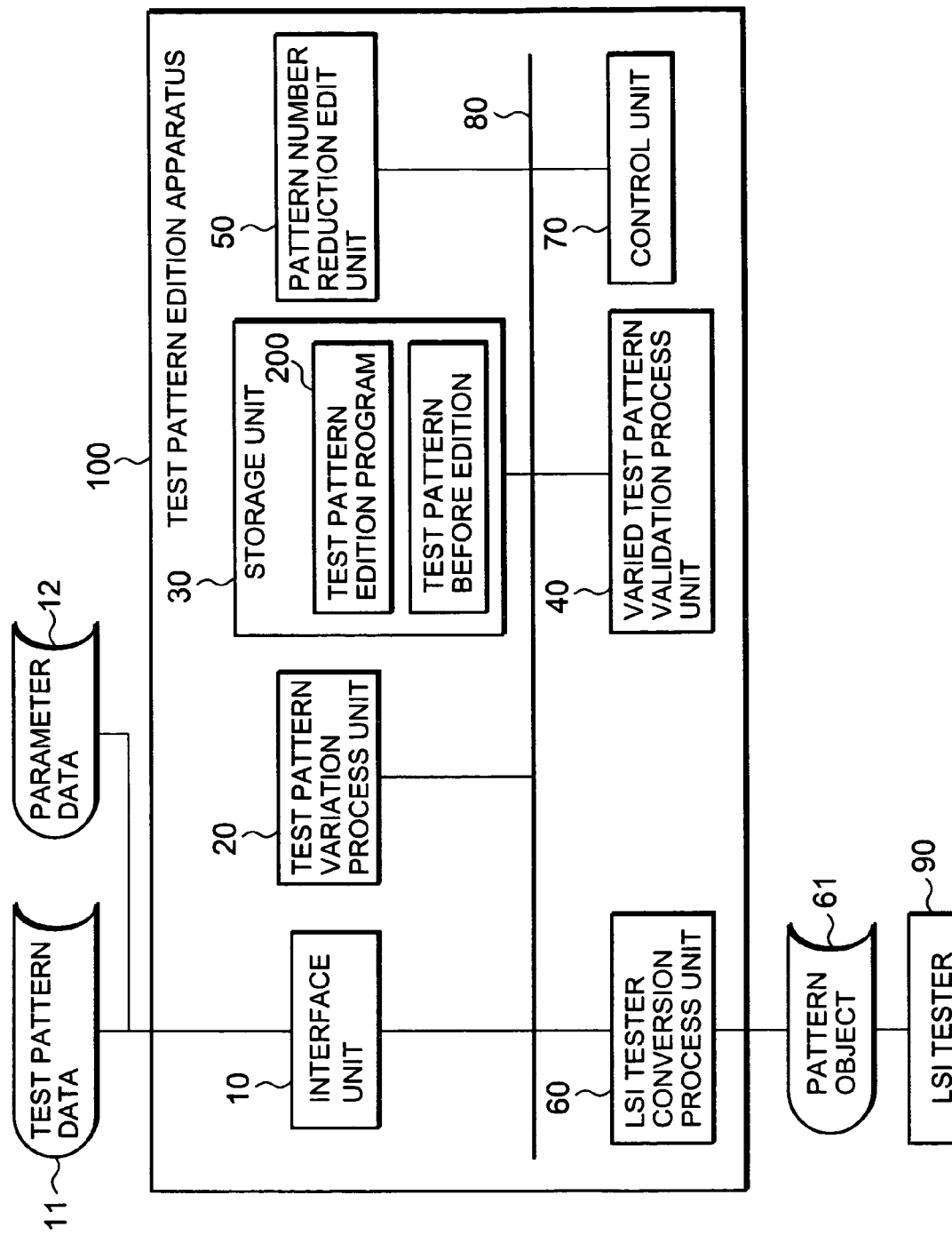
FIG. 1 shows an exemplary block diagram of a configuration of test pattern edition apparatus 100 according to a first exemplary embodiment of the present invention.

FIG. 1 is a block diagram of a configuration of a test pattern edition apparatus 100 according to the first embodiment of the present invention.

In FIG. 1, test pattern edition apparatus 100 according to the first embodiment edits a test pattern having the information for use in a function test of a circuit (e.g., an LSI), and generates a pattern object as a test pattern which can be input to a circuit (e.g., an LSI). Apparatus 100 includes an interface unit 10 connected to external units, test pattern variation process unit 20, storage unit 30, varied test pattern validation process unit 40, pattern number reduction edit unit 50, LSI tester conversion process unit 60, control unit 70 for controlling each unit 10, 20, 30, 40, 50 and 60, and bus 80 connecting each unit.

A test pattern is used in testing the functions and operations of a circuit (e.g., an LSI), and is also referred to as a "function test pattern".

The interface unit 10 may input a test pattern 11 having the information for use in a function test of an LSI, the name of a clock signal pin (e.g., name of an external input pin 114), and a parameter 12 which may be a file indicating the timing of inputting data for each clock signal pin per test rate, the timing of applying a clock signal, the timing of comparing an expected value (timing pattern), etc.

The timing pattern may indicate the number of patterns referring to the period of each timing, the order among the input of data in one test rate, the application of a clock signal, and the comparison of an explanatory view, the number of entire patterns repeating the order, etc.

The "test rate" may refer to a test pattern of one period which is the reference of the configuration of a test pattern.

Parameter 12 may designate the timing of analyzing the presence/absence of a change of input data, the timing of analyzing the presence/absence of a change of a clock signal, and the timing of analyzing the presence/absence of a change of an expected value (analytic timing pattern).

The analytic timing pattern may indicate the number of patterns referring to the period of each analytic timing, the order among the analysis of the presence/absence of a change of input data per test rate, the analysis of the presence/absence of a change of a clock signal, and the analysis of the presence/absence of a change of an expected value, the number of entire patterns repeating the order, etc.

Test pattern variation process unit 20 may input test pattern 11 and parameter 12 through the interface unit 10, and varies test pattern 11 such that the analytic timing designated by parameter 12 can be attained.

The variation may be performed by generating a second test pattern (e.g., varied test pattern 120 of FIG. 8) obtained by repeating regular pattern 122 formed by a plurality of predetermined unit patterns (e.g., one pattern of a plurality of predetermined simulations) from test pattern 11 by inserting a predetermined redundant pattern 121 into test pattern 11.

Storage unit 30 may store a test pattern edition program 200, test pattern 11 as a test pattern before variation, and its operation.

Varied test pattern validation process unit 40 may confirm whether or not the test pattern varied by test pattern variation process unit 20 performs the same operation as test pattern 11 stored in storage unit 30. The confirmation may be performed using a simulation or the like as would be known by one of ordinary skill in the art, after reading the present application.

Pattern number reduction edit unit 50 may perform edition by reducing the number of patterns by defining a plurality of regular patterns 122 as unit patterns in the circuit function test, respectively. Regular patterns 122 may be included by varied test pattern 120, which is varied by test pattern variation process unit 20 and whose operation may be confirmed by varied test pattern validation process unit 40 as the same operation, according to the analytic timing pattern designated by parameter 12.

LSI tester conversion process unit 60 may perform a converting process for an LSI tester 90 on a test pattern, generate pattern object 61, as a test pattern file which can be input to an LSI, from a test pattern edited by pattern number reduction edit unit 50, and output the object to LSI tester 90.

Figure 2:
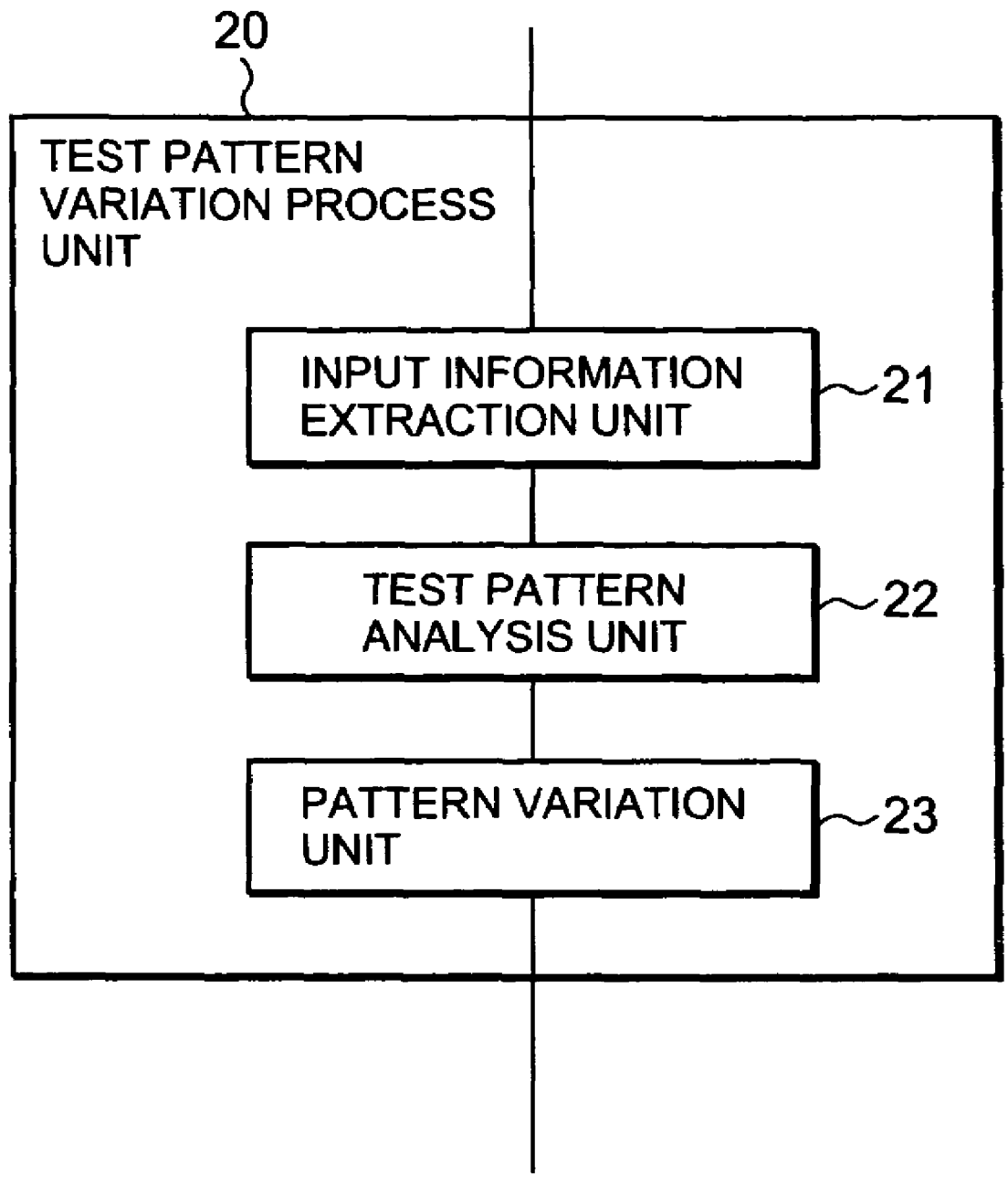
FIG. 2 shows an exemplary block diagram of a configuration of test pattern variation process unit 20 of test pattern edition apparatus 100.

FIG. 2 is an exemplary block diagram of the detailed configuration of test pattern variation process unit 20.

In FIG. 2, test pattern variation process unit 20 may comprise input information extraction unit 21, test pattern analysis unit 22, and pattern variation unit 23.

Input information extraction unit 21 may input test pattern 11 and parameter 12 through the interface unit 10.

For example, for test pattern 11 and parameter 12, with reference to the timing pattern, the name of a clock signal, and the clock signal pin, pattern sequences 11a and 12a indicating the order among the timing of analyzing the presence/absence of a change of input data per test rate, the timing of analyzing the presence/absence of a change of a clock signal, and the timing of analyzing the presence/absence of a change of an expected value, are extracted.

For example, test pattern analysis unit 22 may analyze the pattern sequences 11a and 12a extracted by input information extraction unit 21, and determine whether or not these pattern sequences match.

When it is determined that the pattern sequences do not match, the pattern sequences will be matched. Regular pattern 122 can be generated by inserting a predetermined redundant pattern 121 into test pattern 11, by a set of a leading edge and a trailing edge of the same type of clock signal to be allocated to different regular patterns 122, respectively.

Otherwise, the pattern sequences can be matched by generating a new pattern sequence 12a by changing parameter 12 in FIG. 1.

When test pattern analysis unit 22 determines that the pattern sequences match, pattern variation unit 23 may vary the timing of changing input data, the timing of applying a clock signal, and the timing of comparing an expected value (i.e., data output) based on the timing by sequence specified by parameter 12 for test pattern 11 at each test rate, for example.

The variation may be performed by inserting a predetermined redundant pattern 121 by having for each regular pattern 122, at least once and at an equal interval of the same type of analyzing timing, the timing of analyzing presence/absence of a change of the input data, the timing of analyzing presence/absence of a change of the clock signal, and the timing of analyzing presence/absence of a change of the expected value (i.e., data output).

Additionally, in the configuration of regular pattern 122, a plurality of unit patterns formed from the unit pattern located at the head of a test pattern to the timing of analyzing the presence/absence of a change of input data, the timing of analyzing the presence/absence of a change of a clock signal, and the timing of analyzing the presence/absence of a change of an expected value, can be defined as regular pattern 122.

When the frequency of changes of data input for each regular pattern 122, the frequency of changes of a clock signal, and the frequency of changes of an expected value do not match, the frequency indicating the highest value in all regular patterns 122 may be defined as the frequency of each analytic timing unified in regular pattern 122 repeated in varied test pattern 120.

By the above-mentioned exemplary variation, each regular pattern 122 may be configured by the same analytic timing, for example.

By performing the above-mentioned processes, pattern variation unit 23 varies test pattern 11 at the analytic timing specified by parameter 12, and outputs varied test pattern 120 to varied test pattern validation process unit 40.

Described below is the exemplary operation of test pattern edition apparatus 100.

Figure 3:
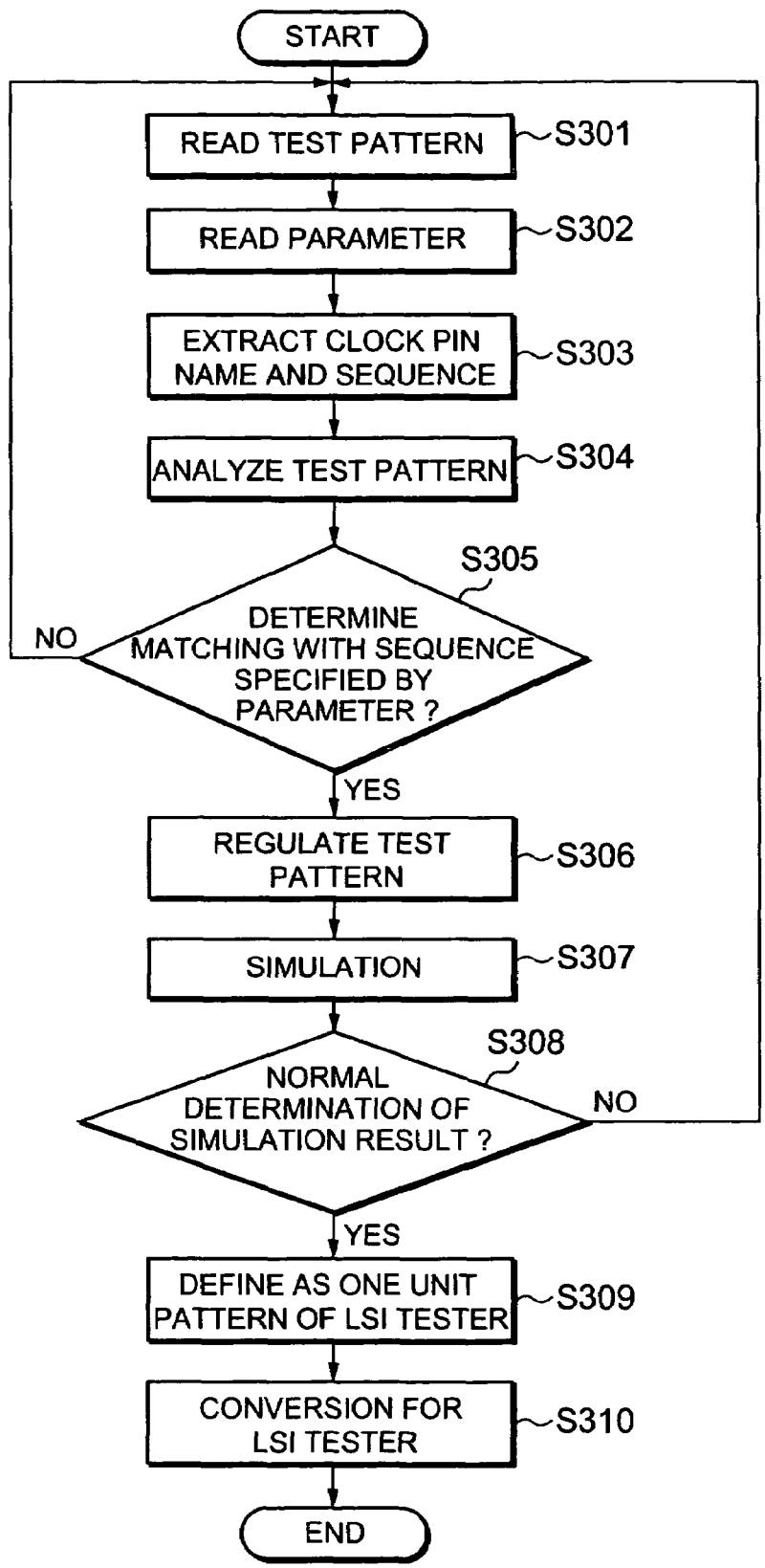
FIG. 3 shows an exemplary flowchart for explanation of an operation of test pattern edition apparatus 100 according to the first exemplary embodiment of the present invention.

FIG. 3 is an exemplary flowchart for explanation of the operation of test pattern edition apparatus 100 according to the first embodiment.

In FIGS. 1-3, first, input information extraction unit 21 of test pattern variation process unit 20 inputs test pattern 11 and parameter 12 through the interface unit 10 (in step 301 and step 302, and "step" is hereinafter referred to as "S").

Next, input information extraction unit 21 extracts a timing pattern, an analytic timing pattern, the name of a clock signal pin, the pattern sequences 11a and 12a, etc. from test pattern 11 and parameter 12 input in S301 and S302 (S303).

Then, test pattern analysis unit 22 analyzes the pattern sequences 11a and 12a extracted in S303 (S304), and determines whether or not the pattern sequences match (S305).

If it is determined in S305 that they do not match, then control is returned to START, test pattern 11 or parameter 12 is changed, and the processes are repeated from S301.

On the other hand, if it is determined in S305 that they match, then, pattern variation unit 23 inserts a predetermined redundant pattern 121, thereby the timing in each order of the pattern sequence 11a is changed such that the timing by the number of patterns specified by parameter 12 can be maintained (S306).

In the above-mentioned process, test pattern 11 is varied such that its analytic timing pattern can match the analytic timing pattern specified by parameter 12.

Additionally, by inserting a predetermined redundant pattern 121 into test pattern 11, a varied test pattern 120 obtained by repeating regular pattern 122 formed by a plurality of predetermined unit patterns is generated. Thus, a plurality of regular patterns 122, as varied test patterns 120, can be defined as one unit pattern in the circuit function test.

Next, varied test pattern validation process unit 40 performs a simulation (S307). Then, it is determined whether or not a varied test pattern 120 obtained such that the analytic timing patterns can match in S306, indicates the same operation as test pattern 11 before the variation (S308).

When there is an error as a result of a simulation (i.e., there is not a normal determination of the simulation result in S308), it is determined that the same operation is not performed, control is returned to START, test pattern 11 or parameter 12 is changed, and the processes are repeated from S301.

When there is no error as a result of a simulation (i.e., a normal determination made in S308), it is determined that the same operation is performed, and a pattern number reduction edit unit 60 defines regular patterns 122 formed by a plurality of unit patterns generated in S306 as one unit pattern in the circuit function test, and performs edition of reducing the number of patterns of test pattern 11 (S309).

LSI tester conversion process unit 60 generates pattern object 61 as a test pattern which can be input to LSI tester 90 from the test pattern edited in S309 (S310).

The first exemplary embodiment is explained below by referring to a practical example.

FIG. 4 is an exemplary schematic pin layout chart showing an example of an LSI.

In FIG. 4, LSI 110 comprises internal area (CORE) 112, external input macro (IM) 111, external output macro (OM) 113, external input pin 114, and an external output pin 115.

FIG. 4 shows CLKA as a clock signal to be applied to an internal area (CORE) 112, CLKB as a clock signal to be applied to an external input macro (IM) 111 and an external output macro (OM) 113, DATAin as input data to an external input pin 114, and DATAout as output data from an external output pin 115.

Figure 5:
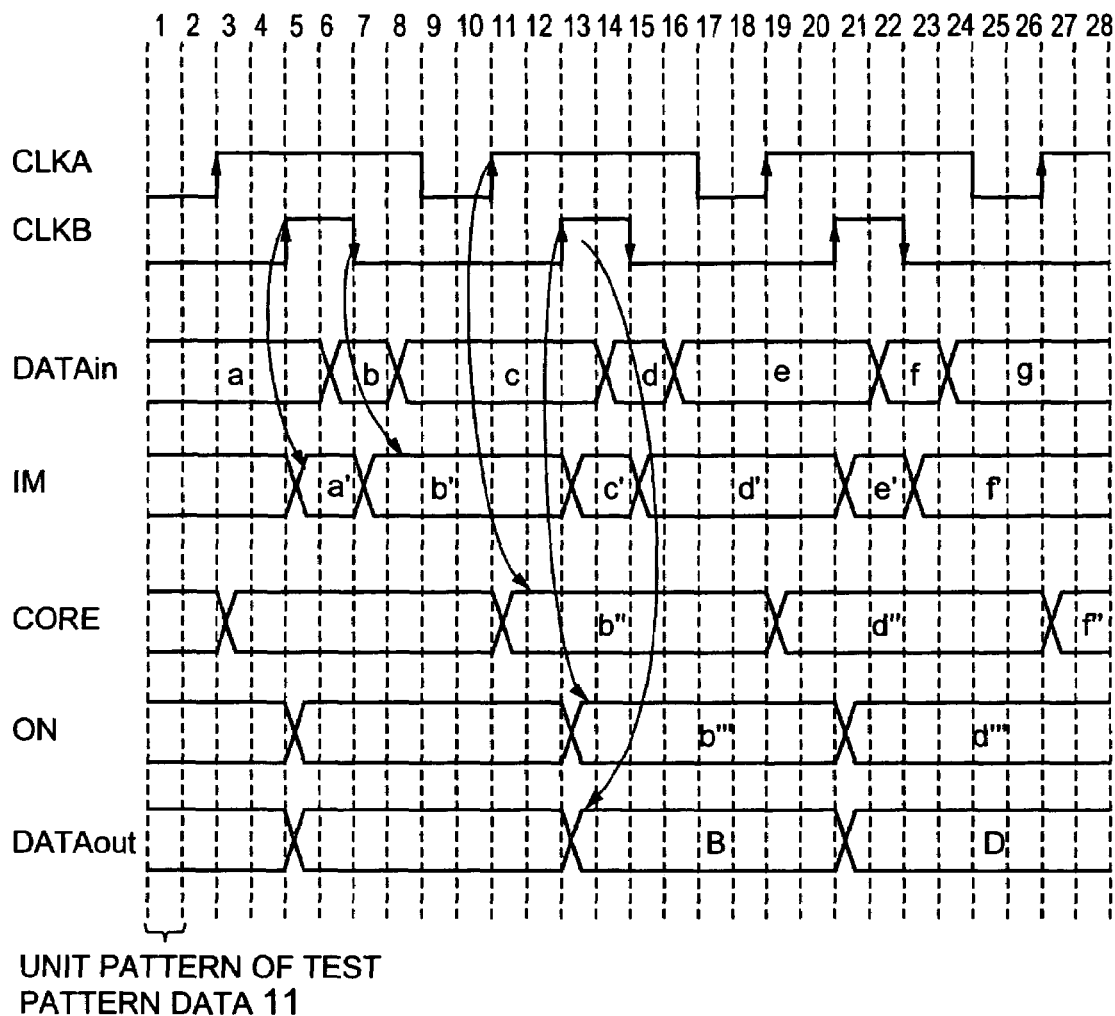
FIG. 5 shows exemplary test pattern 11 according to the first exemplary embodiment of the present invention.

FIG. 5 shows exemplary test pattern 11 for use in a function test for testing the functions and operations of LSI 110 shown in FIG. 4.

In FIG. 5, test pattern 11 is different in input data shown by the DATAin at both edges of the CLKB on one clock cycle formed by 8 patterns per test rate.

For example, input data is different at a set of a leading edge and a trailing edge for the same type of clock signal CLKB.

For example, since the data of "c" is changed into the data of "d" in the fourteenth ($14^{th}$) pattern, the data of "c" (i.e., a change from, "b" to "c") is input at the leading edge of the thirteenth ($13^{th}$) pattern of the CLKB while the data of "d" (i.e., a change from "c" to "d") is input at the head edge of the fifteenth ($15^{th}$) pattern as a pair.

In FIG. 5, when data of "a" is assigned in the first ($1^{st}$) pattern as DATAin in the external input pin 114, the data of "a'" is input to the external input macro (IM) 111 at the leading edge of the CLKB in the fifth ($5^{th}$) pattern.

Next, the data of "a'" input to the external input macro (IM) 111 is input to the internal area (CORE) 112 as the data of "b''" at the leading edge of the CLKA in the eleventh ($11^{th}$) pattern.

Then, the data of "b''" input to the internal area (CORE) 112 is fetched to the external output macro (OM) 113 as the data of "b'''" at the leading edge of the CLKB in the thirteenth ($13^{th}$) pattern.

Finally, the data of "b'''" input to the external output macro (OM) 113 is output from the thirteenth ($13^{th}$) pattern as the data of "B" as the DATAout from the external output pin 115, and used in comparison of an expected value.

Figure 6:
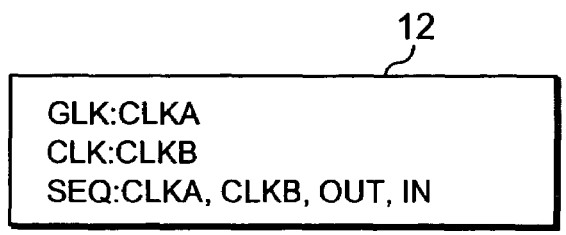
FIG. 6 shows exemplary parameter 12 corresponding to test pattern 11.

FIG. 6 shows exemplary parameter 12 corresponding to test pattern 11 shown in FIG. 5.

In FIG. 6, the CLK record shown in the first and second rows specifies the name of the clock signal pin (e.g., name of an external pin) of the CLKA and CLKB, for example.

In the third row, for example, the timing of analyzing "CLKA" indicating the presence/absence of a change of the CLKA, the timing of analyzing "CLKB" indicating the presence/absence of a change of the CLKB, the timing of analyzing "OUT" indicating the presence/absence of a change of an expected value of an external output pin 115, and the timing of analyzing "IN" indicating the presence/absence of a change of input data of an external input pin 114 may designate the order of the CLKA, CLKB, OUT, and IN in the SEQ record.

Figure 7:
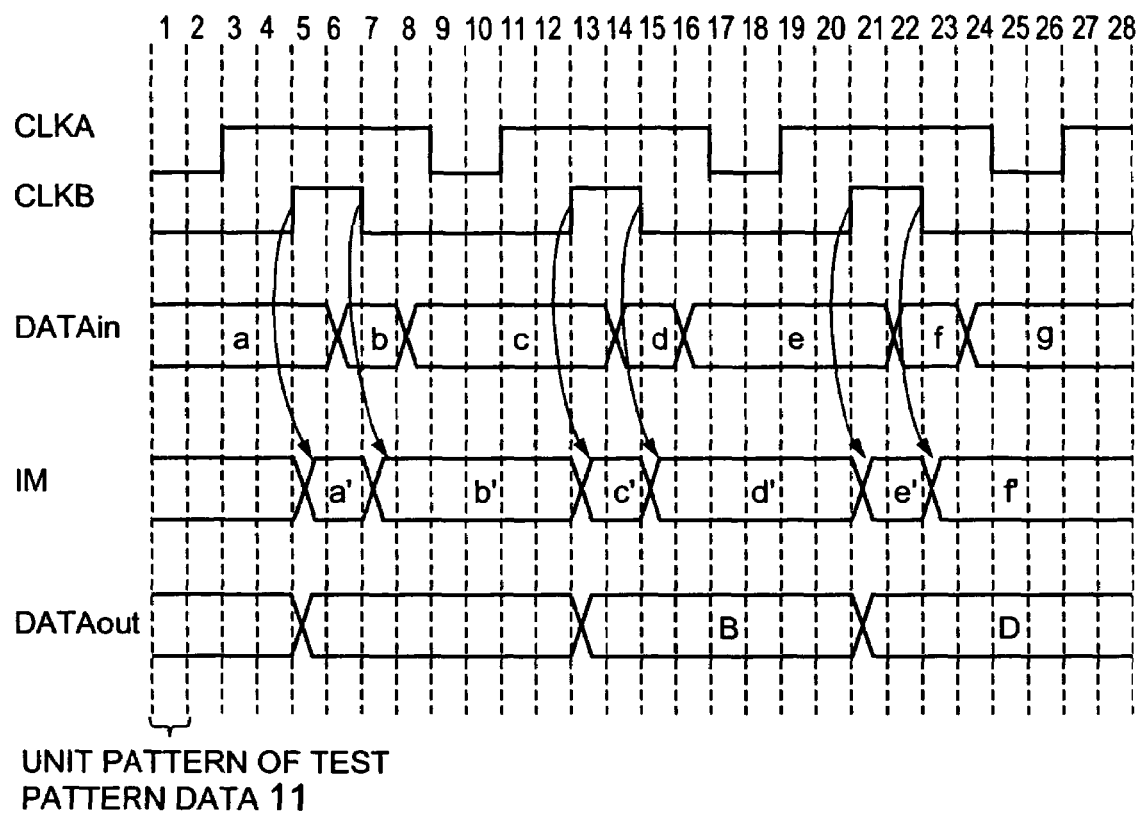
FIG. 7 shows an exemplary test pattern before editing of test pattern 11 according to the first exemplary embodiment of the present invention.

Relating to test pattern 11 shown in FIG. 5, FIG. 7 shows the exemplary pattern before the editing process, and FIG. 8 shows the exemplary pattern after the editing process.

In FIG. 7, relating to the pattern sequence 11a, the portions matching in the pattern sequence 12a and the number of patterns specified by parameter 12 may remain unchanged.

On the other hand, in the portions matching in pattern sequence 12a but not matching in number of patterns, the number of patterns may be made to match by varying test pattern 11, thereby regulating the test pattern.

The pattern sequence 12a may be determined by the CLK record and the SEQ record specified by parameter 12 shown in FIG. 6, for example. For easier explanation, the CLK records are assumed to match.

Since the number of patterns specified here is six (6) by referring to FIGS. 7 and 8, parameter 12 specifies that the CLKA, CLKB, OUT, and IN are repeated every sixth ($6^{th}$) pattern in this order (the number of patterns of regular pattern 122 is 6) as explained below.

That is, this may be because the last "IN" of the SEQ record is repeated in the sixth pattern from the head (leading portion) of test pattern 11.

The test rate of test pattern 11 may refer to a clock cycle formed by eight (8) patterns. In the patterns, the first to sixth patterns match in the pattern sequence 12a and the specified number of patterns. Therefore, they remain unchanged.

For example, test pattern 11 matches parameter 12 in analytic timing pattern, thereby making no changes as explained below.

This may be because according to the SEQ record, in the number of patterns of 6, the change in CLKA is analyzed in the second pattern (changed), the change in CLKB is analyzed in the fourth pattern (changed), the change in expected value (data output) of the external output pin 115 is analyzed in the fifth pattern (changed), and the change in input data is analyzed in the sixth pattern (changed) (FIGS. 7 and 8, regular pattern 122 (1)).

On the other hand, up to the seventh to eighth pattern, matching is detected with the pattern sequence 12a. However, since there is no matching with the specified number of patterns of 6, test pattern 11 is varied, thereby regulating the test pattern.

The regulation may be performed by matching with the specified number of patterns by inserting a predetermined redundant pattern 121 (See FIG. 8) for each test rate.

First in the seventh and eighth patterns, there is no change in CLKA, but a change in CLKB in the seventh pattern. Therefore, following the SEQ record and the analytic timing pattern up to the first to sixth patterns, four patterns, for example, may be inserted as redundant patterns 121 at the head of the seventh pattern such that the change in CLKB can be detected in the fourth pattern of the new regular pattern 122, thereby generating a new regular pattern 122 having a specified number of patterns of 6 (pattern sequence shown in FIG. 8).

Thus, as shown in FIG. 8, in regular pattern 122 (1), for example, the timing of analyzing the presence/absence of a change of CLKA (no change) refers to the second pattern of the new pattern sequence, the timing of analyzing the presence/absence of a change of CLKB (changed) refers to the fourth pattern, the timing of analyzing the presence/absence of a change of an expected value of the external output pin 115 (no change) refers to the fifth pattern, and the timing of analyzing the presence/absence of the change of input data (changed) refers to the sixth pattern (FIG. 8, regular pattern 122 (2)).

When determination as to whether or not there is matching with the pattern sequence 12a and the specified number of patterns is made on all portions of test pattern 11, it is determined on the first to sixth patterns, the ninth to fourteenth patterns, and the seventeenth to twenty-second patterns that there is matching with the pattern sequence 12a and the number of patterns, and they remain unchanged (FIG. 8, regular patterns 122 (1), (3), and (5)).

For example, in FIG. 8, regular patterns 122 (3) and (5), as in FIG. 8, and regular pattern 122 (1), there is matching with the analytic timing pattern specified by parameter 12 for every number of patterns of 6 following the SEQ record.

In FIG. 7, DATAin varies between a leading edge of the thirteenth ($13^{th}$) pattern and a trailing edge of the fifteenth ($14^{th}$) of the clock signal, from "b" to "c". In FIG. 8, as shown in regular pattern 122 (3), and regular pattern 122 (4), the leading edge at the thirteenth ($13^{th}$) pattern and the trailing edge of the clock signal at the fifteenth ($14^{th}$) pattern of CLKB, respectively are allocated to different regular patterns 122.

At the leading edge of the thirteenth ($13^{th}$) pattern allocated to regular pattern 122 (3), data "c" (i.e., a change of input data (from "b"' to "c"'))" is input to the external input macro (IM) 111. At the trailing edge of the fifteenth ($14^{th}$) pattern allocated to regular pattern 122 (4), data "d" (i.e., a change of input data (from "c'" to "d'")) is input to the external input macro (IM) 111. Thus, the change of input data (from "b'" to "c'") and the change of input data (from "c'" to "d'") are allocated to different regular patterns 122.

In FIG. 8, regular pattern 122 (7), the CLKA is changed, but there is no change in the CLKB, the expected value of the external output pin 115, and the input pin. Therefore, the number of patterns of 6 is regulated. As a result, the CLKA is changed in the second pattern of the new pattern sequence, and other conditions match the analytic timing pattern specified by parameter 12.

On the other hand, it is determined that the seventh and eighth patterns, the fifteenth and sixteenth patterns, and the twenty-third and twenty-fourth patterns match the pattern sequence 12a, but do not match the number of patterns.

As described above, four respective redundant patterns 121, for example, may be inserted (pattern for regulation as shown in FIG. 8) between the sixth and seventh patterns, the fourteenth and fifteenth patterns, and the twenty-second and twenty-third patterns, thereby matching with the specified number of patterns (FIG. 8, regular patterns 122 (2), (4), and (6)).

For example, in FIG. 8, regular patterns 122 (4) and (5), as in FIG. 8, regular pattern 122. (2), there is matching with the analytic timing pattern specified by parameter 12 for every number of patterns of 6 following the SEQ record.

Then, in the first embodiment, varied test pattern validation process unit 40 performs a simulation on a varied test pattern 120. As a result, when varied test pattern 120 and test pattern 11 indicate the same operations, a set of every six regular patterns 122 is defined as one unit pattern in the circuit function test, by pattern number reduction edit unit 50 (FIG. 8, regular patterns 122 (1) to (7)).

Finally, LSI tester conversion process unit 60 outputs pattern object 61 to LSI tester 90.

For example, LSI tester 90 can control timings on a pin-to-pin basis. For example, when one unit pattern is defined as 100 ns in LSI tester 90, a change of the CLKA, a change of the CLKB, a change of the output, and a change of the input can be defined as:

The change of the CLKA: 20 ns;
The change of the CLKA: 40 ns;
The change of the CLKS: 60 ns; and
The change of the CLKS: 80 ns.

Since timings can be defined separately in one unit pattern, LSI tester 90 can control four timings in one unit pattern. In other words, there are four timings in one cycle.

Thus, since six patterns as repetitive reference patterns (regular patterns 122) can be defined as one unit pattern in the circuit function test, the number of patterns of the test pattern input to LSI tester 90 can be reduced (FIG. 8, regular patterns 122 (1) to (7)).

Furthermore, by reducing the number of patterns, the clock cycle of eight patterns per test rate before edition is edited to two patterns, thereby successfully speeding up the clock cycle.

As described above, test pattern edition apparatus 100 according to the first embodiment can generate a test pattern with the number of patterns reduced by editing test pattern 11 although input data is different at both edges of a clock signal.

For example, by editing test pattern 11, the number of patterns is reduced from 8 to 2 as explained below.

That is, this may be because by inserting a predetermined redundant pattern 121 (number of patterns of 4), regular pattern 122 (number of patterns of 6) formed by a plurality of unit patterns can be generated by regulating an analytic timing pattern with the timing of analyzing the presence/absence of a change of each type of information about test pattern 11 to a predetermined pattern according to parameter 12.

Accordingly, each regular pattern 122 forming a test pattern can be defined as one unit pattern in the circuit function test.

Furthermore, in a test pattern for a function test of an LSI, a clock cycle can be sped up although input data is different at both edges of a clock signal.

For example, by editing test pattern 11, a clock cycle is reduced from the number of patterns of 8 to the value of the clock cycle of 2.

A reason for the above-mentioned reduction is explained below.

By inserting a predetermined redundant pattern 121 by having for each regular pattern 122, at least once and at an equal interval of the same type of analyzing timing, the timing of analyzing presence/absence of a change of the input data, the timing of analyzing presence/absence of a change of the clock signal, and the timing of analyzing presence/absence of a change of the expected value, are realized. Therefore, each regular pattern 122 is configured with the same timing.

This may be because each regular pattern 122 formed by a plurality of unit patterns can be defined as new unit patterns in the circuit function test under the respective rules.

A test pattern with complicated timings of a change of input data, a change of a clock signal, and a change of an expected value can be realized with a reduced number of patterns and a high speed clock cycle as explained below.

That is, regular pattern 122 is generated by a set of analytic timings in the minimum unit from the unit pattern located at the head (leading portion) of a test pattern to the timing of analyzing the presence/absence of a change of input data, the timing of analyzing the presence/absence of a change of a clock signal, and the timing of analyzing the presence/absence of a change of an expected value can be defined as regular pattern 122, thereby regularly segmenting a test pattern with plural timing units.

Additionally, a test pattern with different input data at both edges of a clock signal can maintain accuracy and realize a function test with the number of patterns reduced, when a generated varied test pattern 120 and a varied test pattern 120 have the same operations.

Example 2

Figure 9:
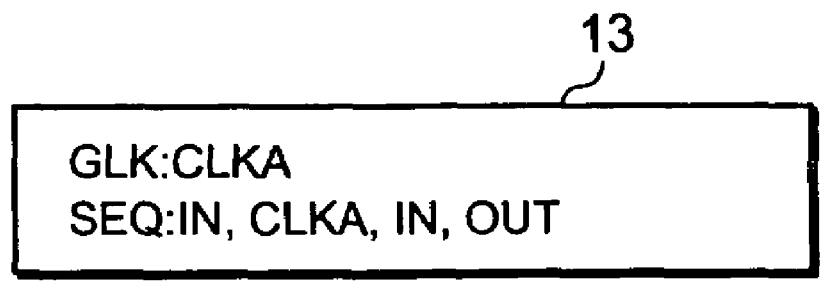
FIG. 9 shows an exemplary parameter 13 corresponding to test pattern 11 according to a second exemplary embodiment of the present invention.
Figure 10:
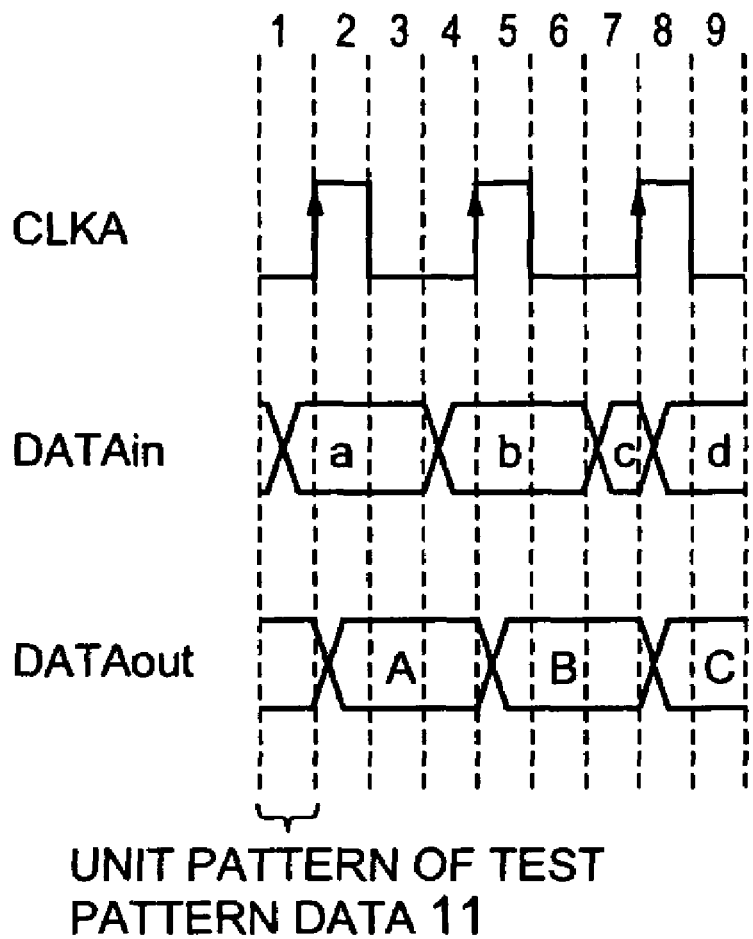
FIG. 10 shows exemplary test pattern 11 before edition according to the second exemplary embodiment of the present invention.
Figure 11:
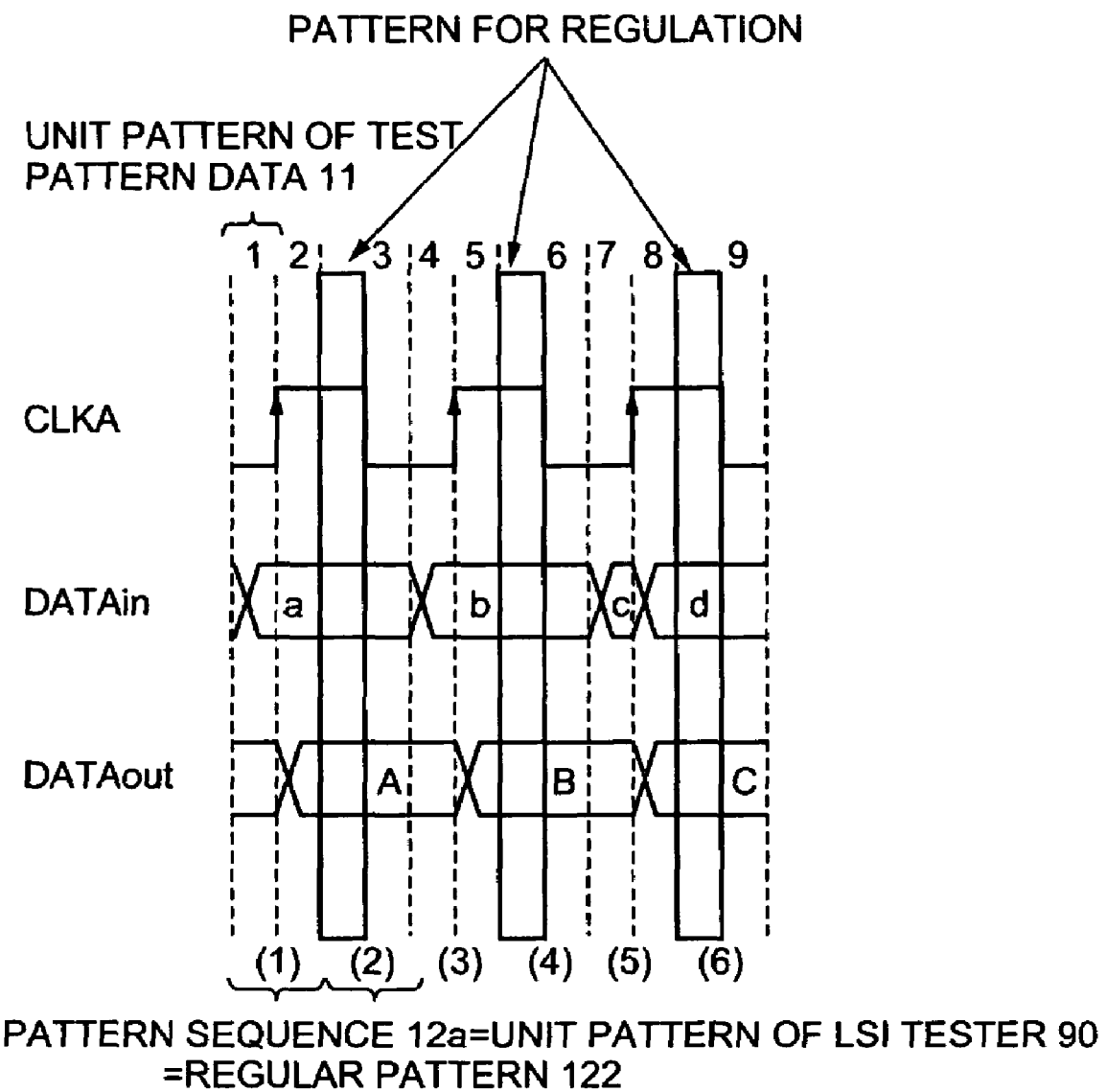
FIG. 11 shows exemplary test pattern 11 after edition according to the second exemplary embodiment of the present invention.

FIGS. 9 to 11 show a second embodiment of the present invention.

Like the first exemplary embodiment, the second exemplary embodiment has a set of different data input at a leading edge and a trailing edge for the same type of clock signal CLKA. For example, the input data is different at the leading edge and the trailing edge of a clock signal at the heads (leading portions) of the seventh and eighth patterns.

FIG. 9 shows an exemplary parameter 13 corresponding to the test pattern according to the second exemplary embodiment.

A difference from the first exemplary embodiment is that there is one type of CLK record, that the SEQ record can be IN, CLK, IN, OUT, and that the specified number of patterns is 4 based on FIG. 10 described below. For example, the number of patterns of regular patterns 122 is 4.

FIG. 10 shows an exemplary test rate of a test pattern before an editing process according to the second exemplary embodiment.

A difference from the first exemplary embodiment is that there is one type of clock signal, that the clock cycle has the number of patterns of 9, etc.

FIG. 11 shows an exemplary test pattern edited according to the second embodiment.

A difference from the first exemplary embodiment is that one redundant pattern 121 (pattern for regulation shown in FIG. 11) is inserted between the second and third patterns, the fifth and sixth patterns, and the eighth and ninth patterns, thus configuring regular pattern 122 (pattern sequence shown in FIG. 11) by the number of patterns of 2.

According to the second exemplary embodiment, the number of patterns of 9 before edition per test rate is reduced to 6 after edition, for example.

According to the second exemplary embodiment, although there is one type of clock signal to be applied and the input data is different at both edges (i.e., leading and trailing edges) of the clock signal, for example, and a test pattern is edited as in the first exemplary embodiment, a test pattern with the number of patterns reduced, is generated.

It is obvious that test pattern edition apparatus 100 according to the present invention can realize its operation as hardware. It also can realize its operation as software by operating the test pattern edition program 200 for performing each means using control unit 70 of the computer processing device. The test pattern edition program 200 may be stored in storage unit 30 (e.g., a magnetic disk, semiconductor memory, other recording media, etc.), and may be loaded from storage unit 30 to control unit 70, and by controlling the operation, each of the above-mentioned functions can be realized.

The present invention has been explained above by referring to a plurality of exemplary embodiments. However, the present invention is not limited to the above-mentioned embodiments, but variations can be embodied within the scope of technological concept of the present invention.

Thus, this invention has been described with reference to exemplary embodiments, this description is not intended as limiting. Various modifications of the illustrative embodiments, as well as other embodiments of the invention, will be apparent to persons skilled in the art upon taking description as a whole. It is, therefore, contemplated that the appended claims will cover any such modifications or embodiments as fall within the true scope of the invention.

Further, the inventor's intent is to encompass all equivalents of all the elements of the claimed invention even if the claims are amended during prosecution.

This application is based on Japanese Patent Application No. 2004-374729 filed on Dec. 24, 2004 and including specification, claims, drawings and summary. The disclosure of the above Japanese Patent Application is incorporated herein by reference in its entirety.

What is claimed is:

1. An apparatus that edits a test pattern used in a circuit function test, comprising:
   a generator that generates a regular pattern that includes a plurality of unit patterns by referring to an analytic timing pattern, said analytic timing pattern designating a timing of analyzing said test pattern, and by inserting a redundant pattern into a test pattern so that said regular pattern matches said analytic timing pattern; and
   a pattern number reduction editor that defines said regular pattern as one test unit pattern in said circuit function test,
   wherein said analytic timing pattern indicates any of a number of patterns referring to a period of each analytic timing, an order among an analysis of a presence/absence of a change of input data per test rate, an analysis of a presence/absence of a change of a clock signal, an analysis of a presence/absence of a change of an expected value, and a number of entire patterns repeating the order.

2. The apparatus according to claim 1, wherein, a second test pattern includes repeated ones of said regular pattern.

3. The apparatus according to claim 1, wherein said test pattern includes:
   input data relating to said circuit function test; and
   a clock signal relating to said circuit function test, wherein when said input data varies between a leading edge and a trailing edge of said clock signal, said redundant pattern is inserted into said test pattern so that said leading edge and said trailing edge of said clock signal, respectively, are allocated to different ones of said regular pattern.

4. The apparatus according to claim 3, wherein said test pattern further includes:
   an expected value obtained corresponding to input data relating to said function test, wherein said redundant pattern is inserted into said test pattern so that said regular pattern includes each of a timing of analyzing a presence/absence of a change of said input data, a timing of analyzing a presence/absence of a change of said clock signal, and a timing of analyzing a presence/absence of a change of said expected value, at least once, and each of said timings in a first pattern occurs correspondingly in a second pattern.

5. The apparatus according to claim 4, wherein,
   a first said regular pattern refers to a pattern from one of said plurality of unit patterns located at a head of said test pattern to one of said plurality of unit patterns simultaneously having said timing of analyzing said presence/absence of a change of said input data, said timing of analyzing said presence/absence of a change of said clock signal, and said timing of analyzing said presence/absence of said expected value,
   wherein said first pattern is defined at a time of last instance of a first change in said clock signal, said input data, and said expected value.

6. The apparatus according to claim 4, wherein,
   a highest frequency of changes of said data input for one said regular pattern, a highest frequency of changes of said clock signal for one said regular pattern, and a highest frequency of changes of said expected value for one said regular pattern, are defined as frequencies of said each of said timings in said regular pattern.

7. The apparatus according to claim 4, further comprising:
   a calculator that calculates each of said timings by analyzing said first pattern.

8. The apparatus according to claim 1, wherein,
   said apparatus inputs a parameter that includes a timing of analyzing a presence/absence of a change of said input data, a timing of analyzing a presence/absence of a change of said clock signal, and a timing of analyzing a presence/absence of said expected value, and
   said each of timings in said regular pattern is the same as those in said parameter.

9. The apparatus according to claim 1, further comprising:
   a verifier that verifies whether or not a second circuit test pattern and said test pattern perform a same operation,
   wherein, when said verifier determines that said same operation is performed, said pattern number reduction edit unit defines said regular pattern as one test unit pattern in said circuit function test.

10. A method of editing a circuit test pattern used in a circuit function test, comprising:
    generating a regular pattern that includes a plurality of unit patterns by referring to an analytic timing pattern, said analytic timing pattern designating a timing of analyzing said test pattern, and by inserting a redundant pattern into a test pattern so that said regular pattern matches said analytic timing pattern; and defining said regular pattern as one test unit pattern in said circuit function test, wherein said analytic timing pattern indicates any of a number of patterns referring to a period of each analytic timing, an order among an analysis of a presence/absence of a change of input data per test rate, an analysis of a presence/absence of a change of a clock signal, an analysis of a presence/absence of a change of an expected value, and a number of entire patterns repeating the order.

11. The method according to claim 10, further comprising:
providing a second circuit pattern that includes repeated ones of said regular pattern.

12. The method according to claim 10, further comprising:
providing said test pattern with input data relating to said circuit function test;

providing said test pattern with a clock signal relating to said circuit function test; and inserting said redundant pattern into said test pattern so that a leading edge and a trailing edge of said clock signal, respectively, are allocated to different ones of said regular patterns, when said input data varies between said leading edge and said trailing edge of said clock signal.

13. The method according to claim 12, further comprising:
obtaining an expected value corresponding to input data relating to said function test, inserting said redundant pattern into said test pattern so that said regular pattern includes each of a timing of analyzing a presence/absence of a change of said input data, a timing of analyzing a presence/absence of a change of said clock signal, and a timing of analyzing a presence/absence of a change of said expected value, at least once, and each of said timings in a first pattern occurs correspondingly in a second pattern.

14. The method according to claim 13, further comprising:
referring a first said regular pattern to a pattern from one of said plurality of unit patterns located at a bead of said test pattern to one of said plurality of unit patterns simultaneously having said timing of analyzing a presence/absence of a change of said input data, said timing of analyzing a presence/absence of a change of said clock signal, and said timing of analyzing a presence/absence of said expected value; and defining said first pattern at a time of last instance of a first change in said clock signal, said input data, and said expected value.

15. The method according to claim 13, further comprising:
defining a highest frequency of changes of said data input for one said regular pattern, a highest frequency of changes of said clock signal for one said regular pattern, and a highest frequency of changes of said expected value for one said regular pattern, as frequencies of said each of said timings in said regular pattern.

16. The method according to claim 13, further comprising:
calculating each of said timings by analyzing said test pattern.

17. The method according to claim 10, further comprising:
inputting a parameter that includes a timing of analyzing a presence/absence of a change of said input data, a timing of analyzing a presence/absence of a change of said clock signal, and a timing of analyzing a presence/absence of said expected value, wherein said each of timings in said regular pattern is the same as those in said parameter.

18. The method according to claim 10, further comprising:
verifying whether or not a second circuit test pattern and said test pattern perform a same operation; and defining said regular pattern as one test unit pattern in said circuit function test, when it is verified that said same operation is performed.

19. An apparatus that edits a test pattern used in a circuit function test, comprising;

means for generating a regular pattern that includes a plurality of unit patterns by referring to an analytic timing pattern, said analytic timing pattern designating a timing of analyzing said test pattern, and by inserting a redundant pattern into a test pattern so that said regular pattern matches said analytic timing pattern; and means for defining said regular pattern as one test unit pattern in said circuit function test, wherein said analytic timing pattern indicates any of a number of patterns referring to a period of each analytic timing, an order among an analysis of a presence/absence of a change of input data per test rate, an analysis of a presence/absence of a change of a clock signal, an analysis of a presence/absence of a change of an expected value, and a number of entire patterns repeating the order.

20. The apparatus according to claim 19, wherein a second test pattern includes repeated ones of said regular pattern.

* * * * *